(12) United States Patent
Furuichi et al.

(10) Patent No.: US 8,807,911 B2
(45) Date of Patent: Aug. 19, 2014

(54) TRANSFER ROBOT AND EQUIPMENT FRONT END MODULE INCLUDING TRANSFER ROBOT WITH VENT PART

(71) Applicant: Kabushiki Kaisha Yaskawa Denki, Kitakyuhsu (JP)

(72) Inventors: Masatoshi Furuichi, Kitakyushu (JP); Masayuki Suzuki, Kitakyushu (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 69 days.

(21) Appl. No.: 13/719,273

(22) Filed: Dec. 19, 2012

(65) Prior Publication Data
US 2013/0323002 A1    Dec. 5, 2013

(30) Foreign Application Priority Data
Jun. 1, 2012 (JP) ................. 2012-125847

(51) Int. Cl.
*H01L 21/677*    (2006.01)
(52) U.S. Cl.
CPC .... *H01L 21/67748* (2013.01); *H01L 21/67742* (2013.01); *Y10S 901/49* (2013.01)
USPC .......................... 414/744.5; 901/49
(58) Field of Classification Search
CPC ... B25J 18/025; B25J 18/00; H01L 21/67742; H01L 21/67751; H01L 21/67109; H01L 21/67303
USPC ......................... 414/744.5; 901/49
See application file for complete search history.

(56) References Cited

U.S. PATENT DOCUMENTS 6,688,189 B2 *    2/2004 Hashimoto et al. ........... 414/935

FOREIGN PATENT DOCUMENTS

| JP | 63-043341 | | 2/1988 |
| JP | 01-289685 | | 11/1989 |
| JP | 10-261690 | | 9/1998 |
| JP | 11-087461 | | 3/1999 |
| JP | 11087461 A | * | 3/1999 |
| JP | 2000-114224 | | 4/2000 |
| JP | 2002-217264 | | 8/2002 |
| JP | 2002-338042 | | 11/2002 |
| JP | 2003-229355 | | 8/2003 |
| JP | 2003229355 A | * | 8/2003 |
| JP | 2008-028419 | | 2/2008 |
| JP | 2008-172089 | | 7/2008 |
| JP | 2008172089 A | * | 7/2008 |

OTHER PUBLICATIONS

Japanese Office Action for corresponding JP Application No. 2012-125847, Jan. 7, 2014.
Japanese Office Action for corresponding JP Application No. 2012-125847, Nov. 5, 2013.

* cited by examiner

*Primary Examiner* — Gerald McClain
(74) *Attorney, Agent, or Firm* — Mori & Ward, LLP

(57) ABSTRACT

A transfer robot according to the embodiment includes an arm unit, a base unit, a guide unit, a lifting unit, and a vent part. The arm unit includes a robot hand capable of holding an object to be transferred. The base unit is formed into a substantially box shape. The guide unit includes a vertical shaft vertically arranged in the base unit. The lifting unit is provided to be raisable and lowerable along the vertical shaft and supports the arm unit at an upper end portion. The vent part is opened in an upper surface of the base unit and vents downflow from an outside to an inside of the base unit.

11 Claims, 5 Drawing Sheets

US 8,807,911 B2

TRANSFER ROBOT AND EQUIPMENT FRONT END MODULE INCLUDING TRANSFER ROBOT WITH VENT PART

CROSS-REFERENCE TO RELATED APPLICATION

This application is based upon and claims the benefit of priority of the prior Japanese Patent Application No. 2012-125847, filed on Jun. 1, 2012, the entire contents of which are incorporated herein by reference.

FIELD

The embodiment discussed herein is directed to a transfer robot and a equipment front end module including a transfer robot.

BACKGROUND

Conventionally, there is known a transfer robot that is arranged in a space formed in a equipment front end module (EFEM) and transfers a substrate, such as a semiconductor wafer.

The transfer robot typically includes an arm body and transfers a substrate, for example, by moving the arm body in a horizontal direction while holding the substrate by the arm body and an end effector provided at the tip portion of the arm body. The arm body itself is often supported by a lifting unit that can perform a raising and lowering operation.

Because products, such as a semiconductor wafer, are handled in the EFEM, it is highly required to keep the air inside the EFEM extremely clean. Therefore, downflow of clean air is often created from the upper portion of the EFEM, however, various transfer robots are also proposed that prevent contamination by particles by using an additional method.

For example, a transfer robot is proposed that prevents adhesion of particles dispersed by a disturbance of downflow by covering a transfer unit including the arm body and the lifting unit described above with a cover member (for example, see Japanese Patent Laid-open Publication H10-261690).

However, the conventional transfer robot has room for further improvement in suppression of particles generated by the raising and lowering operation. Specifically, when a transfer robot has a structure in which the above-described lifting unit is raised and lowered by protruding from a body unit (hereinafter, described as "base unit") of the transfer robot, a substrate may be contaminated by particles dispersed from the inside of the base unit by the raising and lowering operation.

SUMMARY

A transfer robot according to an aspect of an embodiment includes an arm unit, a base unit, a guide unit, a lifting unit and a vent part. The arm unit that includes a robot hand capable of holding an object to be transferred. The base unit formed into a substantially box shape. The guide unit that includes a vertical shaft vertically arranged in the base unit. The lifting unit that is provided to be raisable and lowerable along the vertical shaft and supports the arm unit at an upper end portion. The vent part that is opened in an upper surface of the base unit and vents downflow from an outside to an inside of the base unit.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENT

Hereinafter, an embodiment of a transfer robot and a equipment front end module that includes a transfer robot disclosed in the present application will be explained in detail with reference to the accompanying drawings. This invention is not limited to the following embodiment.

In the following, an explanation is given of a transfer robot that is arranged in an EFEM and transfers a semiconductor wafer that is an object to be transferred as an example. Moreover, a "semiconductor wafer" is described as a "wafer". Moreover, a "robot hand", which is an end effector, is described as a "hand".

Figure 1:
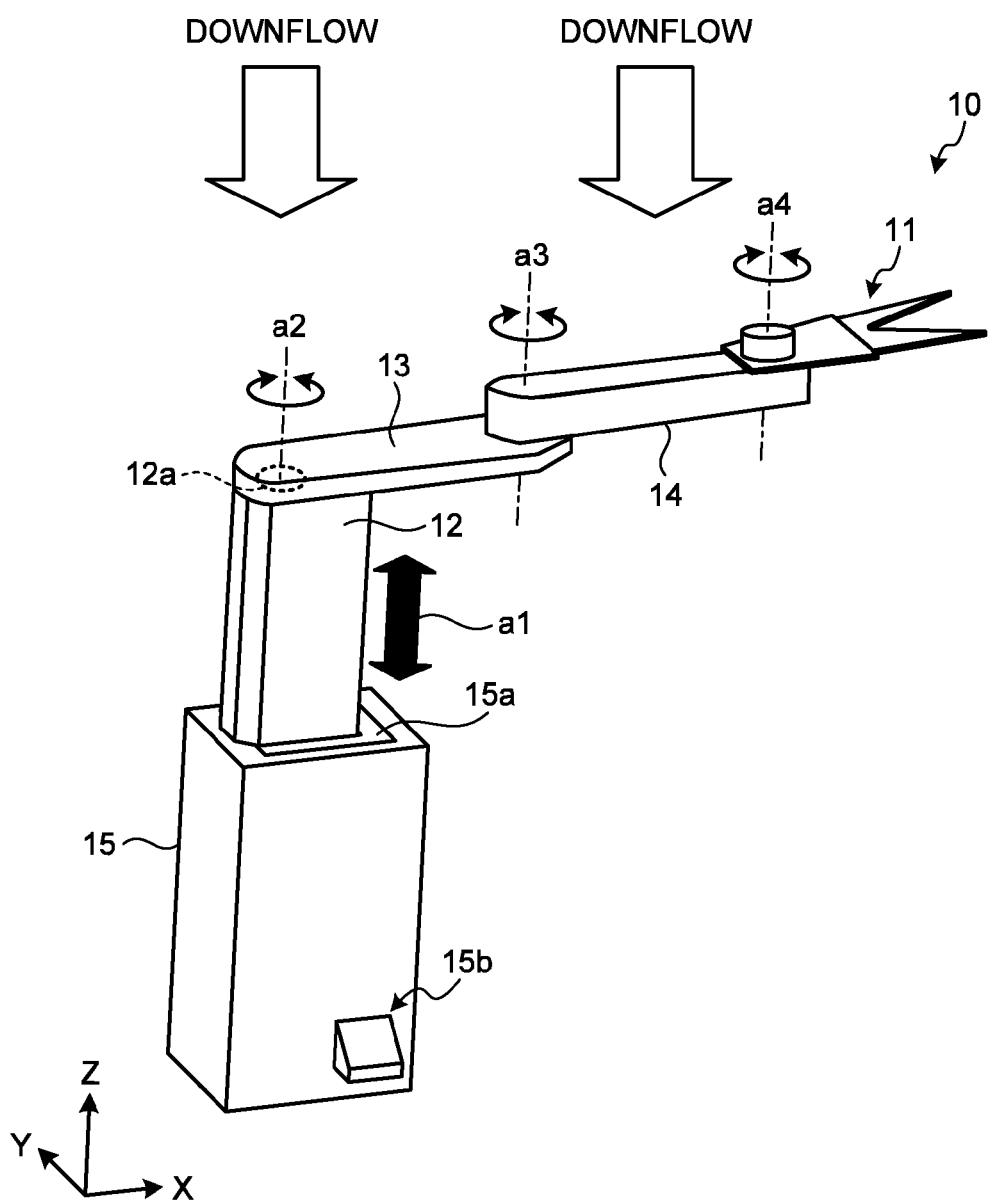
FIG. 1 is a schematic perspective view illustrating the entire configuration of a transfer robot according to an embodiment.

First, the configuration of a transfer robot according to an embodiment will be explained with reference to FIG. 1. FIG. 1 is a schematic perspective view illustrating the configuration of a transfer robot 10 according to the embodiment.

For ease of understanding of an explanation, in FIG. 1, a three-dimensional Cartesian coordinate system that includes a Z axis, in which a positive direction is vertically upward and a negative direction is vertically downward, is illustrated. Therefore, the direction along an XY plane indicates a "horizontal direction". The Cartesian coordinate system is shown in some cases in other drawings that are used for the following explanation.

Moreover, in the following, for a component composed of a plurality of elements, only one of the elements is denoted by a reference numeral and reference numerals of other elements are omitted in some cases. In this case, one element denoted by a reference numeral and other elements have the same configuration.

As shown in FIG. 1, the transfer robot 10 includes a hand 11, a lifting unit 12, a first arm 13, a second arm 14, and a base unit 15. The base unit 15 includes a vent part 15a and an exhaust part 15b.

The first arm 13 and the second arm 14 configure an arm unit that is an arm of the transfer robot 10.

The base unit 15 is formed into a substantially box shape and is a main body of the transfer robot 10 fixed to a bottom wall portion (not shown) of an EFEM. The base unit 15 is not necessarily fixed to the bottom wall portion of the EFEM and, for example, may be fixed to a sidewall portion. Moreover, the base unit 15 may be made movable along a travelling mechanism or the like provided in the EFEM without being fixed.

The vent part 15a is an opening opened in the upper surface of the base unit 15. The vent part 15a introduces downflow of clean air formed via a filter unit (not shown) provided in the upper portion of the EFEM into the base unit 15 to be vented.

Moreover, the exhaust part 15b exhausts exhaust flow of the downflow, which is vented from the outside to the inside of the base unit 15, vertically downward. The detailed configuration of the vent part 15a and the exhaust part 15b will be described later with reference to FIG. 2A and the following drawings.

The lifting unit 12 is provided to be raisable and lowerable along the vertical shaft vertically arranged in the base unit 15 (see double-headed arrow a1 in FIG. 1) and raises and lowers the entire arm unit supported at the upper end portion along the vertical direction (Z-axis direction).

The first arm 13 is connected to the lifting unit 12 via a rotational joint (not shown) about an axis a2 to be pivotable with respect to the lifting unit 12 (see double-headed arrow about the axis a2 in FIG. 1).

The second arm 14 is connected to the first arm 13 via a rotational joint (not shown) about an axis a3 to be pivotable with respect to the first arm 13 (see double-headed arrow about the axis a3 in FIG. 1).

The hand 11, which is an end effector that holds a wafer, is connected to the second arm 14 via a rotational joint (not shown) about an axis a4 to be pivotable with respect to the second arm 14 (see double-headed arrow about the axis a4 in FIG. 1). Therefore, the entire arm unit including the hand 11 moves in the horizontal direction.

Each of the above-described rotational joints rotates according to the driving of a drive source, such as a motor. For example, the drive source that rotates the rotational joint about the axis a2 is arranged in the space formed to include an opening 12a opened in the upper surface of the lifting unit 12.

Figure 2A:
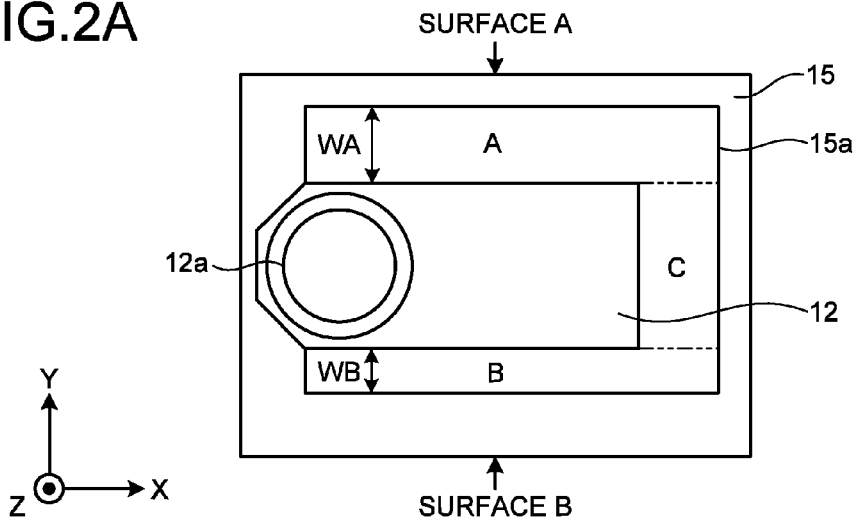
FIG. 2A is a first schematic diagram of a base unit viewed from above.
Figure 2B:
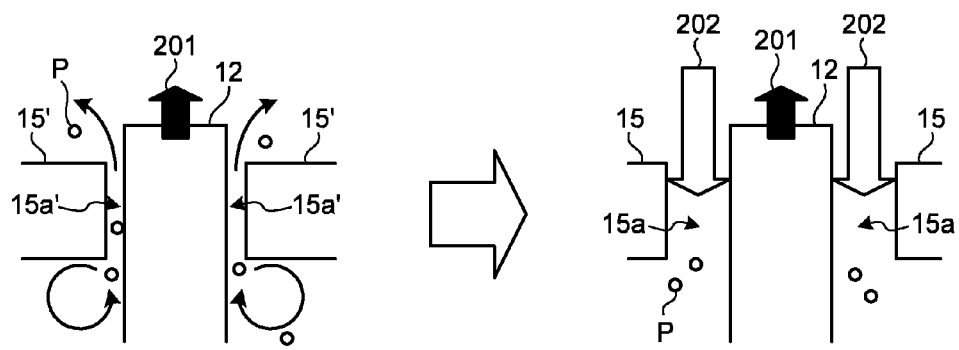
FIG. 2B is a schematic diagram illustrating a comparison between a conventional technology and the present embodiment viewed from the side surface.
Figure 2C:
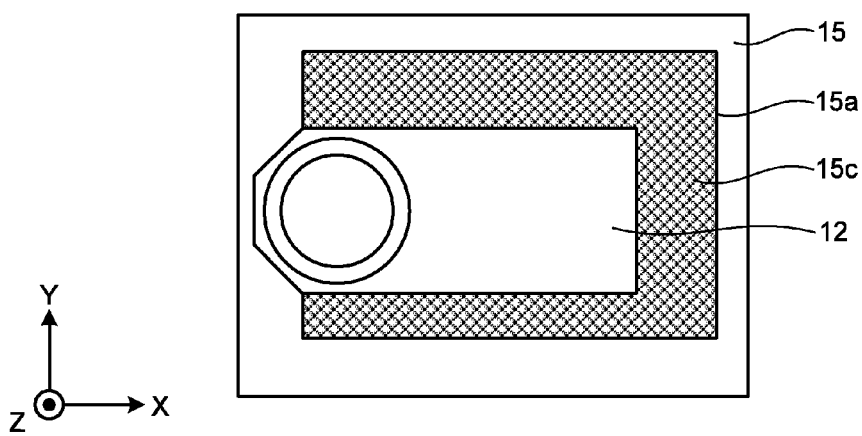
FIG. 2C is a second schematic diagram of the base unit viewed from above.

Next, the detailed configuration of the base unit 15 will be explained with reference to FIG. 2A and FIG. 2C. FIG. 2A and FIG. 2C are schematic diagrams of the base unit 15 viewed from above.

As already explained with reference to FIG. 1, as shown in FIG. 2A, the base unit 15 includes the vent part 15a in the upper surface thereof. The vent part 15a is formed along the periphery of the lifting unit 12.

As shown in FIG. 2A, the opening 12a is provided in a portion on the negative direction side in the X-axis in the upper surface of the lifting unit 12. Along with the opening 12a, the lifting unit 12 itself is also arranged on the negative direction side in the X-axis.

In this manner, the opening 12a and the lifting unit 12 are arranged offset in a predetermined direction, therefore, the pivot area of the arm unit can be increased on the predetermined direction side.

Then, in this case, as shown in FIG. 2A, the vent part 15a is formed into a substantially U-shape composed of an area A, an area B, and an area C along part of the periphery of the lifting unit 12, that is, along the sidewalls of the base unit 15 excluding the sidewall in the predetermined direction described above. At this time, the vent part 15a is formed such that each of the area A, the area B, and the area C has a sufficient width.

The above-described sufficient width will be explained with reference to FIG. 2B. FIG. 2B is a schematic diagram illustrating a comparison between a conventional technology and the present embodiment viewed from the side surface. FIG. 2B schematically illustrates the lifting unit 12 and a base unit 15' in the conventional technology on the left side on the paper surface and the lifting unit 12 and the base unit 15 in the present embodiment on the right side on the paper surface.

As shown on the left side in FIG. 2B, in the conventional technology, a space 15a' is provided between the lifting unit 12 and the base unit 15' for enabling the raising and lowering operation. However, for example, when the lifting unit 12 is raised (see arrow 201 in FIG. 2B), turbulence is easily generated through the space 15a' (see curved arrows in FIG. 2B).

Then, in the conventional technology, particles P may be dispersed by the turbulence and diffused into an EFEM and may contaminate a wafer.

Thus, as shown on the right side in FIG. 2B, in the present embodiment, the vent part 15a having a sufficient width between the lifting unit 12 and the base unit 15 is provided. The sufficient width in the present embodiment indicates a width sufficient to make it difficult to cause turbulence and smoothly introduce downflow indicated by arrows 202 even if the lifting unit 12 is, for example, raised (see arrow 201 in FIG. 2B).

Consequently, because it is possible to make the particles P difficult to disperse by turbulence and easily contain the particles P in the base unit 15 by downflow, generation of the particles P by the raising and lowering operation can be suppressed.

The point that a width WA of the area A shown in FIG. 2A is set larger than a width WB of the area B in the vent part 15a will be described in detail later with reference to FIG. 4B. Moreover, in the following, as shown in FIG. 2A, the sidewall on the side of the area A forming the base unit 15 is described as a "surface A" and the sidewall on the side of the area B forming the base unit 15 is described as a "surface B" in some cases.

As shown in FIG. 2C, a cover member 15c, in the surface of which a plurality of holes is formed and which is made of, for example, what is called a net member or a perforated metal, may be provided to cover the vent part 15a. The shape, the arrangement, and the like of the holes are not specifically limited, and any shape and arrangement may be applied as long as it is possible to introduce downflow without generating turbulence in the base unit 15.

FIG. 2C illustrates a case where a plurality of holes is formed substantially uniformly in the surface of the cover member 15c by hatching. In this manner, because the rectifying action can be obtained and turbulence can be made difficult to occur in the base unit 15, it is more preferable to form a plurality of holes substantially uniformly.

Consequently, downflow can be rectified and vented smoothly into the base unit 15 through the holes. In the present embodiment, the cover member 15c is provided to cover the vent part 15a, however, for ease of understanding of an explanation, the cover member 15c is omitted from the drawings in some cases.

Figure 3A:
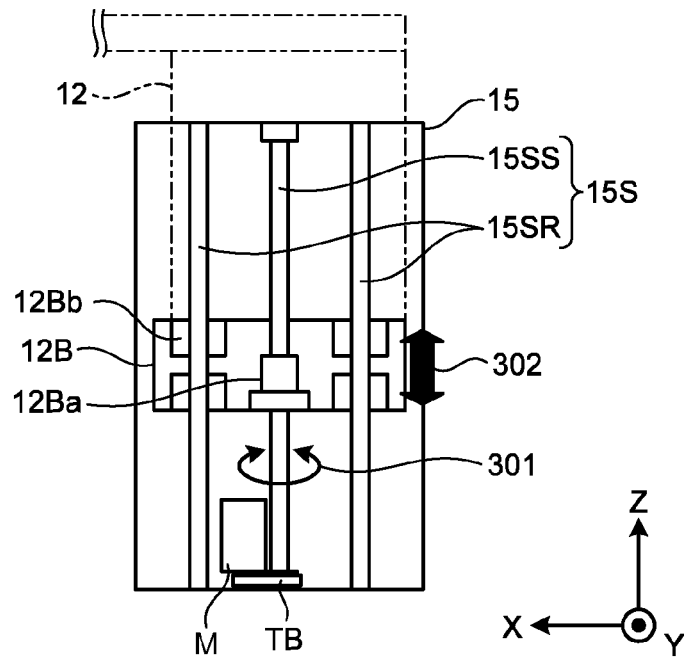
FIG. 3A is an internal schematic diagram of the base unit viewed from a positive direction of the Y axis.
Figure 3B:
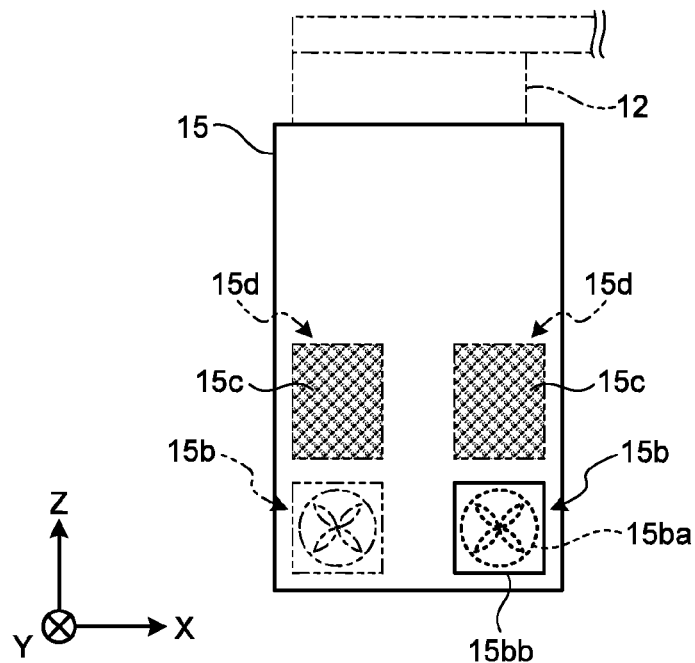
FIG. 3B is a schematic diagram of the base unit viewed from a negative direction of the Y axis.

Next, the detailed configuration of the base unit 15 viewed from the side surface will be explained with reference to FIG. 3A and FIG. 3B. FIG. 3A is an internal schematic diagram of the base unit 15 viewed from the positive direction of the Y axis, that is, viewed from the "surface A" side. FIG. 3B is a schematic diagram of the base unit 15 viewed from the negative direction of the Y axis, that is, viewed from the "surface B" side.

As shown in FIG. 3A, the base unit 15 includes therein a ball screw 15SS that is a vertically arranged vertical shaft and a pair of guide rails 15SR. The ball screw 15SS and a pair of the guide rails 15SR configure a guide unit 15S.

Moreover, the base unit 15 includes a motor M. The output shaft of the motor M is connected to the lower end portion of the ball screw 15SS via a timing belt TB and rotates the ball screw 15SS about the shaft center (see double-headed arrow 301 in FIG. 3A).

As shown in FIG. 3A, a lifting base 12B is provided at the lower end portion of the lifting unit 12. The lifting base 12B includes a ball nut 12Ba and lifting blocks 12Bb.

The ball nut 12Ba is a member that can move along the ball screw 15SS by engaging with the ball screw 15SS and converting rotary motion of the ball screw 15SS into linear motion. Moreover, the lifting block 12Bb is a member that is slidably engaged with the guide rail 15SR.

Consequently, the lifting base 12B can move along the guide unit 15S (see double-headed arrow 302 in FIG. 3A) along with the rotation of the ball screw 15SS and raises and lowers the lifting unit 12.

Moreover, as shown in FIG. 3B, the base unit 15 includes the exhaust part 15b in the "surface B". The exhaust part 15b includes a fan 15ba and an exhaust cover 15bb provided to cover the fan 15ba.

The fan 15ba exhausts downflow vented into the base unit 15. The exhaust cover 15bb is a cover member that is shaped to exhaust exhaust flow from the fan 15ba vertically downward.

In FIG. 3B, a case where one exhaust part 15b is provided is indicated by a solid line, however, the number of the exhaust parts 15b and the arrangement position of the exhaust part 15b are not limited and, for example, another exhaust part 15b may be provided at a position symmetrical to the exhaust part 15b as indicated by a two-dot chain line.

Moreover, as indicated by a two-dot chain line in FIG. 3B, for example, an air inlet 15d may be provided above the exhaust part 15b or the like. With the provision of the air inlet 15d, when downflow to be introduced through the vent part 15a becomes insufficient, for example, downflow can be compensated from the sidewall side and introduced into the base unit 15 in which the atmospheric pressure is reduced and a disturbance of exhaust flow of downflow in the base unit 15 due to the irregularities of the lifting unit 12 can be rectified.

Therefore, downflow can be sufficiently introduced into the base unit 15 and a disturbance of exhaust flow of downflow in the base unit 15 can be rectified, thus, particles can be prevented from dispersing. It is more preferable to provide the cover member 15c to cover the air inlet 15d as shown in FIG. 3B in a similar manner to the case of the vent part 15a for obtaining the rectifying action of rectifying downflow.

Moreover, FIG. 3B illustrates an example where the air inlet 15d is provided in the "surface B" in which the exhaust part 15b is also provided, however, the surface in which the air inlet 15d is provided is not specifically limited and the air inlet 15d may be provided in any sidewall forming the base unit 15. Moreover, the exemplification of FIG. 3B does not limit the shape of the air inlet 15d and the number of the air inlets 15d.

Figure 4A:
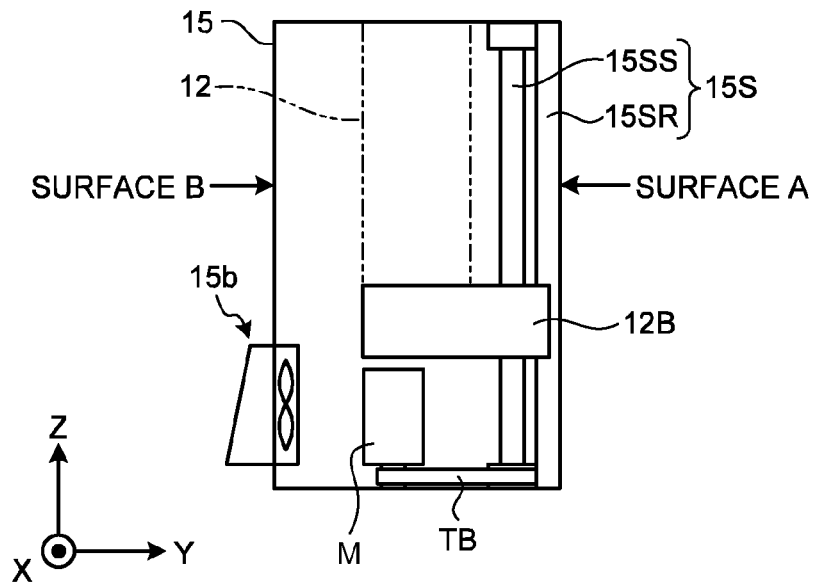
FIG. 4A is an internal schematic diagram of the base unit viewed from a positive direction of the X axis.

The arrangement relationship between the guide unit 15S and the exhaust part 15b explained with reference to FIG. 3A and FIG. 3B will be clarified with reference to FIG. 4A. FIG. 4A is an internal schematic diagram of the base unit 15 viewed from the positive direction of the X axis.

As shown in FIG. 4A, the guide unit 15S that includes the ball screw 15SS and the guide rails 15SR is provided to be adjacent to the "surface A" of the base unit 15. Moreover, as described above, the exhaust part 15b is provided in the "surface B" of the base unit 15.

Therefore, the guide unit 15S and the exhaust part 15b are provided on the opposing sidewalls of the base unit 15. The motor M is arranged between the opposing sidewalls.

On the premise of the above point, next, the width (that is, the width WA of the area A illustrated in FIG. 2A) of the vent part 15a on the surface A side will be explained. FIG. 4B is a schematic diagram of the base unit 15 viewed from above for explaining the width of the vent part 15a on the surface A side.

Figure 4B:
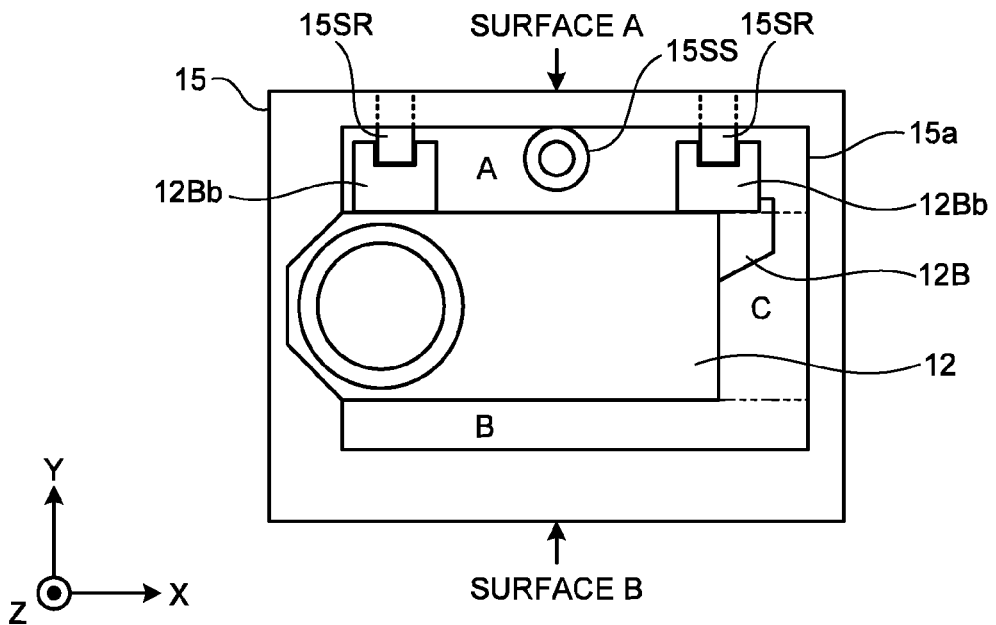
FIG. 4B is a schematic diagram of the base unit viewed from above for explaining the width of a vent part on a surface A side.

As shown in FIG. 4B and explained above, the ball screw 15SS and the guide rails 15SR configuring the guide unit 15S are provided to be adjacent to the "surface A" of the base unit 15.

Therefore, the lifting blocks 12Bb of the lifting base 12B provided to be slidable with respect to the guide unit 15S and the like are also provided near the "surface A" of the base unit 15.

In other words, in the present embodiment, the movable units that easily cause the particles P to disperse by the raising and lowering operation of the lifting unit 12 are concentrated near the "surface A" of the base unit 15. On the premise of this, the width WA of the area A of the vent part 15a is set larger than other widths (for example, the width WB of the area B), thereby positively introducing downflow into the "surface A" side on which the movable units are concentrated.

Specifically, as shown in FIG. 4B, when viewed from above, the vent part 15a is formed to maintain the width WA of the area A so that at least part of each member (such as the ball screw 15SS and the guide rails 15SR) configuring the guide unit 15S overlaps the vent part 15a.

Consequently, it is possible to effectively suppress the particles P at the movable parts at which the particles P are easily generated.

Figure 5:
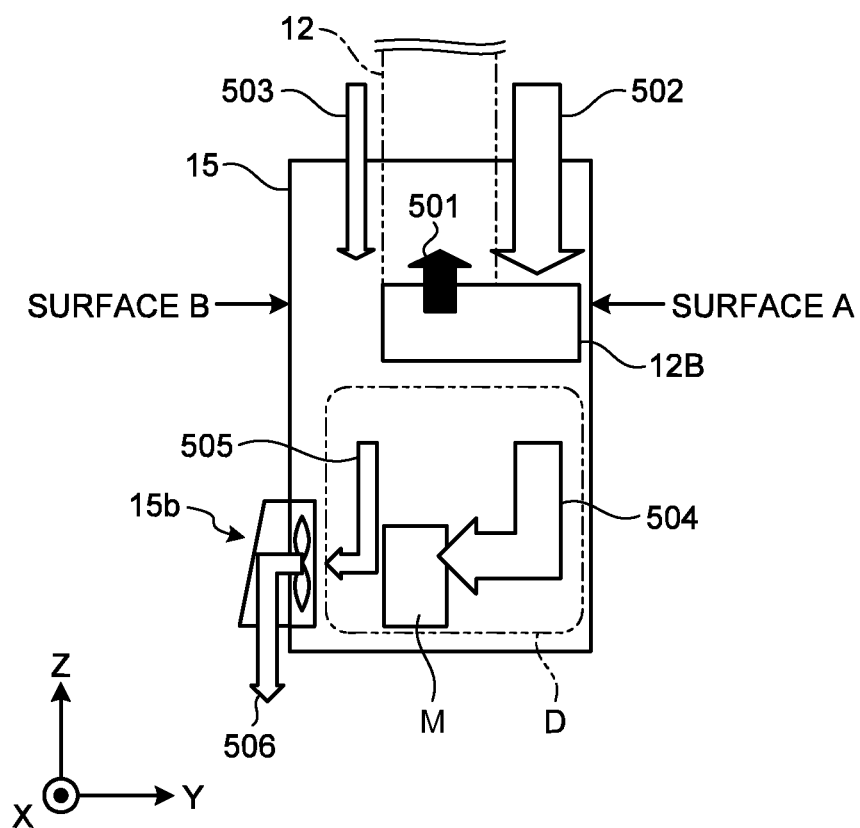
FIG. 5 is an internal schematic diagram of the base unit viewed from the positive direction of the X axis illustrating flow paths of introduced downflow.

Next, the flow path of downflow introduced into the base unit 15 will be explained with reference to FIG. 5. FIG. 5 is an internal schematic diagram of the base unit 15 viewed from the positive direction of the X axis illustrating the flow paths of the introduced downflow. FIG. 5 illustrates only members necessary for an explanation in a simplified manner.

As shown in FIG. 5, the lifting unit 12 is raised by moving the lifting base 12B (see arrow 501 in FIG. 5). In this case, the downflow (see arrow 502 in FIG. 5) introduced from the area A on the "surface A" side flows around along the inner wall of the base unit 15 in a space D formed by the raising of the lifting unit 12 and follows the flow path reaching the exhaust part 15b (see arrow 504 in FIG. 5).

The flow path of downflow formed in this manner can cool the motor M while effectively suppressing the particles P generated at the movable units.

Moreover, as shown in FIG. 5, the downflow (see arrow 503 in FIG. 5) introduced from the area other than the area A (for example, the area B on the "surface B" side) flows down in the vertical direction along the periphery of the lifting unit 12 and follows the flow path reaching the exhaust part 15b (see arrow 505 in FIG. 5).

Then, the downflow is exhausted vertically downward from the exhaust part 15b together with the downflow introduced from the area A (see arrow 506 in FIG. 5).

In other words, the downflow introduced into the base unit 15 is exhausted in such a way that it does not disturb downflow in the entire EFEM outside the base unit 15 while being rectified and suppressing the particles P in the base unit 15.

Therefore, downflow environment in the entire EFEM in which the transfer robot 10 is arranged can be maintained in an appropriate state while suppressing generation of the particles P by the raising and lowering operation of the transfer robot 10.

As described above, the transfer robot according to the present embodiment includes the arm unit, the base unit, the guide unit, the lifting unit, and the vent part. The arm unit includes the robot hand capable of holding an object to be transferred. The base unit is formed into a substantially box shape. The guide unit includes the vertical shaft vertically arranged in the base unit. The lifting unit is provided to be raisable and lowerable along the vertical shaft and supports the arm unit at the upper end portion. The vent part is opened in the upper surface of the base unit and vents downflow from the outside to the inside of the base unit.

Therefore, according to the transfer robot in the present embodiment, generation of particles by the raising and lowering operation can be suppressed.

The above-described embodiment illustrates a case where the lifting unit is arranged on the predetermined direction side with respect to the base unit, however, the arrangement position of the lifting unit with respect to the base unit is not limited. Therefore, for example, the lifting unit may be arranged in the center of the base unit.

Moreover, the above-described embodiment illustrates a case where a mechanism (hereinafter, described as "lifting mechanism") that raises and lowers the lifting unit is configured to include a ball screw and a ball nut, however, the components of the lifting mechanism is not limited thereto. For example, the lifting mechanism may be configured to raise and lower the lifting unit by driving a belt or driving a linear motor.

Moreover, the above-described embodiment exemplifies a case where the vent part is formed along part of the periphery of the lifting unit, however, the vent part may be formed to surround the entire periphery of the lifting unit.

Moreover, the above-described embodiment exemplifies a case where the lifting unit supports the arm unit that moves in the horizontal direction, however, the moving direction of the arm unit is not limited.

Moreover, the above-described embodiment is explained by exemplifying a single-arm robot, however, the number of the arm units is not limited as long as the lifting unit that supports the arm unit is included. Therefore, a multi-arm robot having two or more arms may be applied.

Moreover, the above-described embodiment is explained by exemplifying a case where one hand is provided at the tip portion of the arm unit, however, the number of hands is not limited and may be two or more.

Moreover, the above-described embodiment is explained by exemplifying a case where an object to be transferred is mainly a wafer, however, the type of an object to be transferred is not limited.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A transfer robot comprising:
an arm unit that includes a robot hand capable of holding an object to be transferred;
a base unit formed into a substantially box shape;
a guide unit that includes a vertical shaft vertically arranged in the base unit;
a lifting unit that is provided to be raisable and lowerable along the vertical shaft and supports the arm unit at an upper end portion; and
a vent part that is opened in an upper surface of the base unit and vents downflow of air from an outside to an inside of the base unit,
wherein the vent part is such that a width of a portion corresponding to an upper portion of the guide unit in the upper surface of the base unit is set larger than a width of a portion that does not correspond to the upper portion of the guide unit in the upper surface of the base unit, and
wherein the vertical shaft is disposed in the width of the portion corresponding to the upper portion of the guide unit in the upper surface of the base unit that is set larger.

2. The transfer robot according to claim 1, wherein the vent part is formed in the upper surface of the base unit along a periphery of the lifting unit.

3. The transfer robot according to claim 2, wherein
the lifting unit is arranged to be adjacent to one sidewall among sidewalls forming the base unit, and
the vent part is formed along a sidewall other than the one sidewall.

4. The transfer robot according to claim 3, wherein the vent part is covered with a cover member in a surface of which a plurality of holes is formed.

5. The transfer robot according to claim 2, wherein the vent part is covered with a cover member in a surface of which a plurality of holes is formed.

6. The transfer robot according to claim 1, wherein the vent part is covered with a cover member in a surface of which a plurality of holes is formed.

7. The transfer robot according to claim 1, wherein
the guide unit is arranged to be adjacent to one sidewall among sidewalls forming the base unit, and
the vent part is formed to overlap part of the guide unit when viewed from above.

8. The transfer robot according to claim 1, further comprising an exhaust part that includes a fan provided in a sidewall of the base unit, and an exhaust cover that is provided to cover the fan and is shaped to exhaust an exhaust flow from the fan vertically downward.

9. The transfer robot according to claim 8, wherein the exhaust part is provided in a sidewall on a side opposing a sidewall adjacent to which the guide unit is provided.

10. A equipment front end module comprising the transfer robot according to claim 1.

11. A transfer robot comprising:
a transfer means for transferring an object to be transferred by using an arm unit that includes a robot hand capable of holding the object;
a guide means that includes a vertical shaft vertically arranged in a base unit formed into a substantially box shape;
a lifting means that is provided to be raisable and lowerable along the vertical shaft and supports the arm unit at an upper end portion; and
a venting means that is opened in an upper surface of the base unit and vents downflow of air from an outside to an inside of the base unit;
wherein the venting means is such that a width of a portion corresponding to an upper portion of the guide means in the upper surface of the base unit is set larger than a width of a portion that does not correspond to the upper portion of the guide means in the upper surface of the base unit, and wherein the vertical shaft is disposed in the width of the portion corresponding to the upper portion of the guide means in the upper surface of the base unit that is set larger.

* * * * *